(12) United States Patent
Cao

(10) Patent No.: US 11,615,726 B2
(45) Date of Patent: Mar. 28, 2023

(54) GATE DRIVING CIRCUIT AND DISPLAY DEVICE

(71) Applicant: WUHAN CHINA STAR OPTOELECTRONICS TECHNOLOGY CO., LTD., Hubei (CN)

(72) Inventor: Haiming Cao, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 17/056,795

(22) PCT Filed: Sep. 25, 2020

(86) PCT No.: PCT/CN2020/117599
§ 371 (c)(1),
(2) Date: Nov. 19, 2020

(87) PCT Pub. No.: WO2022/041370
PCT Pub. Date: Mar. 3, 2022

(65) Prior Publication Data
US 2022/0198975 A1    Jun. 23, 2022

(30) Foreign Application Priority Data
Aug. 31, 2020  (CN) .......................... 202010897065.6

(51) Int. Cl.
G09G 3/20    (2006.01)

(52) U.S. Cl.
CPC ....... *G09G 3/20* (2013.01); *G09G 2300/0408* (2013.01); *G09G 2300/0809* (2013.01); (Continued)

(58) Field of Classification Search
CPC .................................................. G09G 2310/08
See application file for complete search history.

(56) References Cited

U.S. PATENT DOCUMENTS 10,127,878 B1 * 11/2018 Lv ........................ G11C 19/184
2016/0307531 A1    10/2016 Xiao
(Continued)

FOREIGN PATENT DOCUMENTS

CN          104766575 A       7/2015
CN          106098008 A      11/2016
(Continued)

*Primary Examiner* — Doon Y Chow
(74) *Attorney, Agent, or Firm* — Mark M. Friedman

(57) ABSTRACT

A gate driving circuit and a display device are provided. The gate driving circuit includes a plurality of gate driving units, each of the gate driving units Each of the stage of the gate driving unit comprises two driving signal output units and a cascading signal output unit. The two driving signal output units can in turn output a constant high voltage signal and a wave signal such that a gate driving circuit could output two driving signals at the same time. In contrast to the conventional art, which needs two gate driving circuits to output two driving signals, this embodiment of the present invention could reduce the number of the clock line and the number of the TFTs such that the display device could have a narrow side frame.

14 Claims, 4 Drawing Sheets

(52) U.S. Cl.
CPC ............... *G09G 2310/0267* (2013.01); *G09G 2310/0289* (2013.01); *G09G 2310/08* (2013.01)

(56) References Cited

U.S. PATENT DOCUMENTS

| | | | |
|---|---|---|---|
| 2016/0343335 A1* | 11/2016 | Cao | G09G 3/3677 |
| 2018/0211621 A1 | 7/2018 | Gong et al. | |
| 2019/0197976 A1 | 6/2019 | Sasaki | |
| 2019/0285930 A1* | 9/2019 | Chen | G09G 3/3677 |
| 2020/0357341 A1* | 11/2020 | Xue | G09G 3/003 |

FOREIGN PATENT DOCUMENTS

| | | | | |
|---|---|---|---|---|
| CN | 106601205 A | | 4/2017 | |
| CN | 108109593 A | | 6/2018 | |
| CN | 108399882 A | * | 8/2018 | ......... G06K 9/00013 |
| CN | 108399882 A | | 8/2018 | |
| CN | 108735162 A | | 11/2018 | |
| CN | 109935217 A | | 6/2019 | |
| CN | 111477190 A | | 7/2020 | |
| JP | 2007325387 A | | 12/2007 | |
| KR | 20070035223 A | | 3/2007 | |

\* cited by examiner

GATE DRIVING CIRCUIT AND DISPLAY DEVICE

CROSS REFERENCE

This application is a US national phase application based upon an International Application No. PCT/CN2020/117599, filed on Sep. 25, 2020, which claims the priority of Chinese Patent Application No. 202010897065.6, entitled "GATE DRIVING CIRCUIT AND DISPLAY DEVICE", filed on Aug. 31, 2020, the disclosure of which is incorporated herein by reference in its entirety.

FIELD OF THE INVENTION

The present invention relates to a display technology, and more particularly, to a gate driving circuit and a display device.

BACKGROUND

A display device is widely used in all kinds of electronic products. The GOA (gate driver on array) circuit is an important component in the display device. The GOA technology is also a line-scanning driving technology, which forms the gate driver directly on the array substrate to perform a line-by-line scan driving technique. The GOA technology is good for the narrowing the side frame and thus is widely used in the display technology.

As the progress of the display technology, the types of the GOA circuits become various. In a LTPS display, the MOSFET connected to the driving transistor may a negative voltage drift and cause a higher leakage current of the gate of the driving transistor. This might cause the low frequency display inefficiency. In order to solve this problem, the number of MOSFETs is increased to two and the two MOSFETs could work in turn. In this scenario, the GOA circuit needs to provide two gate driving signals to the two MOSFETs such that they could work in turn. Conventionally, two GOA circuits are used to complete the above function. This design could double the number of the clock lines and the TFTs and thus is not good for a narrow side frame. The driving chip may have an unsatisfactory supportability due to a larger number of the clock lines.

Technical Problem

Conventionally, in order to output two driving signals, two GOA circuits are used. This design could double the number of the clock lines and the number of TFTs and thus is not good for a narrow side frame. The driving chip may have an unsatisfactory supportability due to a larger number of the clock lines.

SUMMARY

Technical Solution

One objective of an embodiment of the present invention is to provide a gate driving circuit is disclosed. The gate driving circuit comprises a plurality of gate driving units. Each of the gate driving units comprises: a cascading unit, configured to output a cascading signal; a first output signal, configured to output a first driving signal; and a second output signal, configured to output a second driving signal; wherein the first driving signal is a wave signal and the second driving signal is a constant high voltage signal or the first driving signal is a constant high voltage signal and the second driving signal is a wave signal.

In an embodiment of the present invention, the first output unit comprises: a first bootstrap output module, configured to pull up an output voltage level of the first output unit; and a first pull-down maintaining module, configured to pull down and maintain the output voltage level of the first output unit.

In an embodiment of the present invention, the first bootstrap output module is electrically connected to the first pull-down maintaining module, and the first pull-down maintaining module controls the first bootstrap output module to output the first driving signal of the constant high voltage.

In an embodiment of the present invention, the second output unit comprises: a second bootstrap output module, configured to pull up an output voltage level of the second output unit; and a second pull-down maintaining module, configured to pull down and maintain the output voltage level of the second output unit.

In an embodiment of the present invention, the second bootstrap output module is electrically connected to the second pull-down maintaining module, and the second pull-down maintaining module controls the second bootstrap output module to output the second driving signal of the constant high voltage.

In an embodiment of the present invention, each of the gate driving unit further comprises: a first transferring module, electrically connected between the cascading unit and the first bootstrap output module, configured to transfers a first output signal to the first bootstrap output module; and a second transferring module, electrically connected between the cascading unit and the second bootstrap output module, configured to transfers a second output signal to the second bootstrap output module.

In an embodiment of the present invention, each of the gate driving units further comprises: a pull-up maintaining module, electrically connected to the first pull-down maintaining module and the second pull-down maintaining module, configured to pull up and maintain voltage levels of control ends of the first pull-down maintaining module and the second pull-down maintaining module; a pull-down module, electrically connected to the first pull-down maintaining module and the second pull-down maintaining module, configured to pull down the voltage levels of the control ends of the first pull-down maintaining module and the second pull-down maintaining module.

In an embodiment of the present invention, the first pull-down maintaining module is electrically connected to a first control signal input end and the second pull-down maintaining module is electrically connected to a second control signal input end.

In an embodiment of the present invention, the first control signal input end inputs a low voltage level signal to the first pull-down maintaining module, the second control signal input end inputs a high voltage level signal to the second pull-down maintaining module, the first driving signal is the wave signal and the second driving signal is the constant high voltage signal.

In an embodiment of the present invention, the first control signal input end inputs a high voltage level signal to the first pull-down maintaining module, the second control signal input end inputs a low voltage level signal to the second pull-down maintaining module, the first driving signal is the constant high voltage signal and the second driving signal is the wave signal.

In an embodiment of the present invention, the first bootstrap output module and the second bootstrap output module are electrically connected to a first high voltage signal input end, and the pull-up maintaining module is electrically connected to a second high voltage signal input end. A voltage level of the first voltage signal input end is higher than a voltage level of the second voltage signal input end.

In an embodiment of the present invention, the cascading unit is electrically connected to the second high voltage signal input end, a cascading signal input end, a first clock signal input end, a second clock signal input end, a low voltage signal input end, a cascading signal output end and a first node, and the cascading signal output end is configured to output the cascading signal. The first transferring module is electrically connected to the first node, the first clock signal input end and a third node. The second transferring module is electrically connected to the first node, the first clock signal input end and a fourth node. The pull-up maintaining module is electrically connected to a second clock signal input end, the second high voltage signal input end and a second node. The pull-down module is electrically connected to the first node, the low voltage signal end and the second node. The first bootstrap output module is electrically connected to the third node, the first high voltage signal input end, the second high voltage signal input end and a first driving signal output end, the first driving signal output end is configured to output the first driving signal. The first pull-down maintaining module is electrically connected to the second node, the third node and the first control signal input end. The second bootstrap output module is electrically connected to the fourth node, the first high voltage signal input end, the second high voltage signal input end and the second driving signal output end, and the second driving signal output end is configured to output the second driving signal. The second pull-down maintaining module is electrically connected to the second node, the fourth node and the second control signal input end.

In an embodiment of the present invention, the cascading unit comprises a first transistor, a second transistor, a third transistor and a fourth transistor; a gate, a source and a drain of the first transistor are respectively electrically connected to the cascading signal input end, the second high voltage signal input end and the first node; a gate, a source and a drain of the second transistor are respectively electrically connected to the first node, the first clock input end and the cascading signal output end; a gate, a source and a drain of the third transistor are respectively electrically connected to the second clock signal input end, the low voltage signal input end and the cascading signal output end; and a gate, a source and a drain of the fourth transistor are respectively electrically connected to the second clock signal input end, the low voltage signal input end and the first node. The first transferring module comprises a fifth transistor and a capacitor; a gate, a source and a drain of the fifth transistor are respectively electrically connected to the first node, the first clock signal input end and the third node; and two electrodes of the first capacitor are respectively electrically connected to the first node and the third node. The second transferring module comprises a sixth transistor and a second capacitor; a gate, a source and a drain of the sixth transistor are respectively electrically connected to the first node, the first clock signal input end and the fourth node; and two electrodes of the second capacitor are respectively electrically connected to the first node and the fourth node. The pull-up maintaining module comprises a seventh transistor and a third capacitor; a gate, a source and a drain of the seventh transistor are respectively electrically connected to the second clock signal input end, the second high voltage signal input end and the second node; and two electrodes of the third capacitor are respectively electrically connected to the second node and the low voltage signal input end. The pull-down module comprises an eighth transistor; and a gate, a source and a drain of the eighth transistor are respectively electrically connected to the first node, the low voltage signal input end and the second node. The first bootstrap output module comprises a ninth transistor, a tenth transistor and a fourth capacitor; a gate, a source and a drain of the ninth transistor are respectively electrically connected to the second high voltage signal input end, the third node and the fifth node; a gate, a source and a drain of the tenth transistor are respectively electrically connected to the fifth node, the first high voltage signal input end and the first driving signal output end; and two electrodes of the fourth capacitor are respectively electrically connected to the fifth node and the first driving signal output end. The first pull-down maintaining module comprises a $11^{th}$ transistor and a $12^{th}$ transistor; a gate, a source and a drain of the $11^{th}$ transistor are respectively electrically connected to the second node, the first control signal input end and the third node; and a gate, a source and a drain of the $12^{th}$ transistor are respectively electrically connected to the second node, the first control signal input end and the first driving signal output end. The second bootstrap output module comprises a $13^{th}$ transistor, a $14^{th}$ transistor and a fifth capacitor; a gate, a source and a drain of the $13^{th}$ transistor are respectively electrically connected to the second high voltage signal input end, the fourth node and the sixth node; a gate, a source and a drain of the $14^{th}$ transistor are respectively electrically connected to the sixth node, the first high voltage signal input end and the second driving signal output end; and two electrodes of the fifth capacitor are respectively connected to the sixth node and the second driving signal output end. The second pull-down maintaining module comprises a $15^{th}$ transistor and a $16^{th}$ transistor; a gate, a source and a drain of the $15^{th}$ transistor are respectively electrically connected to the second node, the second control signal input end and the fourth node; and a gate, a source and a drain of the $16^{th}$ transistor are respectively electrically connected to the second node, the second control signal input end and the second driving signal output end.

In an embodiment of the present invention, the plurality of the gate driving units have following relationship: the cascading signal input end of the gate driving unit of a current stage is electrically connected to the cascading signal output end of the gate driving unit of a previous stage.

In an embodiment of the present invention, the gate driving circuit provides a clock signal through a first clock signal line, a second clock signal line and a third clock signal line; the first clock signal input end and the second clock signal input end of the gate driving unit of a $(k+3i)^{th}$ stage are respectively electrically connected to the first clock signal line and the second clock signal line; the first clock signal input end and the second clock signal input end of the gate driving unit of a $(k+3i+1)^{th}$ stage are respectively electrically connected to the second clock signal line and the third clock signal line; the first clock signal input end and the second clock signal input end of the gate driving unit of a $(k+3i+2)^{th}$ stage are respectively electrically connected to the third clock signal line and the first clock signal line; and k is an integer larger than or equal to 1 and i is an integer larger than or equal to 0.

According to an embodiment of the present invention, a display device is disclosed. The display device comprises a gate driving circuit. The gate driving circuit comprises a plurality of gate driving units. Each of the gate driving units comprises: a cascading unit, configured to output a cascading signal; a first output signal, configured to output a first driving signal; and a second output signal, configured to output a second driving signal; wherein the first driving signal is a wave signal and the second driving signal is a constant high voltage signal or the first driving signal is a constant high voltage signal and the second driving signal is a wave signal.

In an embodiment of the present invention, the first output unit comprises: a first bootstrap output module, configured to pull up an output voltage level of the first output unit; and a first pull-down maintaining module, configured to pull down and maintain the output voltage level of the first output unit. The first bootstrap output module is electrically connected to the first pull-down maintaining module, and the first pull-down maintaining module controls the first bootstrap output module to output the first driving signal of the constant high voltage.

In an embodiment of the present invention, the second output unit comprises: a second bootstrap output module, configured to pull up an output voltage level of the second output unit; and a second pull-down maintaining module, configured to pull down and maintain the output voltage level of the second output unit. The second bootstrap output module is electrically connected to the second pull-down maintaining module, and the second pull-down maintaining module controls the second bootstrap output module to output the second driving signal of the constant high voltage.

In an embodiment of the present invention, each of the gate driving unit further comprises: a first transferring module, electrically connected between the cascading unit and the first bootstrap output module, configured to transfers a first output signal to the first bootstrap output module; a second transferring module, electrically connected between the cascading unit and the second bootstrap output module, configured to transfers a second output signal to the second bootstrap output module; a pull-up maintaining module, electrically connected to the first pull-down maintaining module and the second pull-down maintaining module, configured to pull up and maintain voltage levels of control ends of the first pull-down maintaining module and the second pull-down maintaining module; and a pull-down module, electrically connected to the first pull-down maintaining module and the second pull-down maintaining module, configured to pull down the voltage levels of the control ends of the first pull-down maintaining module and the second pull-down maintaining module. The first pull-down maintaining module is electrically connected to a first control signal input end and the second pull-down maintaining module is electrically connected to a second control signal input end.

In an embodiment of the present invention, the first control signal input end inputs a low voltage level signal to the first pull-down maintaining module, the second control signal input end inputs a high voltage level signal to the second pull-down maintaining module, the first driving signal is the wave signal and the second driving signal is the constant high voltage signal; or the first control signal input end inputs a high voltage level signal to the first pull-down maintaining module, the second control signal input end inputs a low voltage level signal to the second pull-down maintaining module, the first driving signal is the constant high voltage signal and the second driving signal is the wave signal.

Advantageous Effects

According to an embodiment of the present invention, each stage of gate driving units comprises two driving signal output units, which could in turn output a constant high voltage signal and a wave signal. This allows a single gate driving circuit to simultaneously output two driving signals. In contrast to the conventional art, which use two gate driving circuits to output two driving signals, the number of the clock lines and the number of TFTs could be reduced and thus could be better used to realize a display with a narrow side frame.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

According to an embodiment of the present invention, a gate driving circuit is provided. The gate driving circuit comprises a plurality of stages of gate driving units. Each of the stage of the gate driving unit comprises two driving signal output units and a cascading signal output unit. The two driving signal output units can in turn output a constant high voltage signal and a wave signal such that a gate driving circuit could output two driving signals at the same time. In contrast to the conventional art, which needs two gate driving circuits to output two driving signals, this embodiment of the present invention could reduce the number of the clock line and the number of the TFTs such that the display device could have a narrow side frame.

Figure 1:
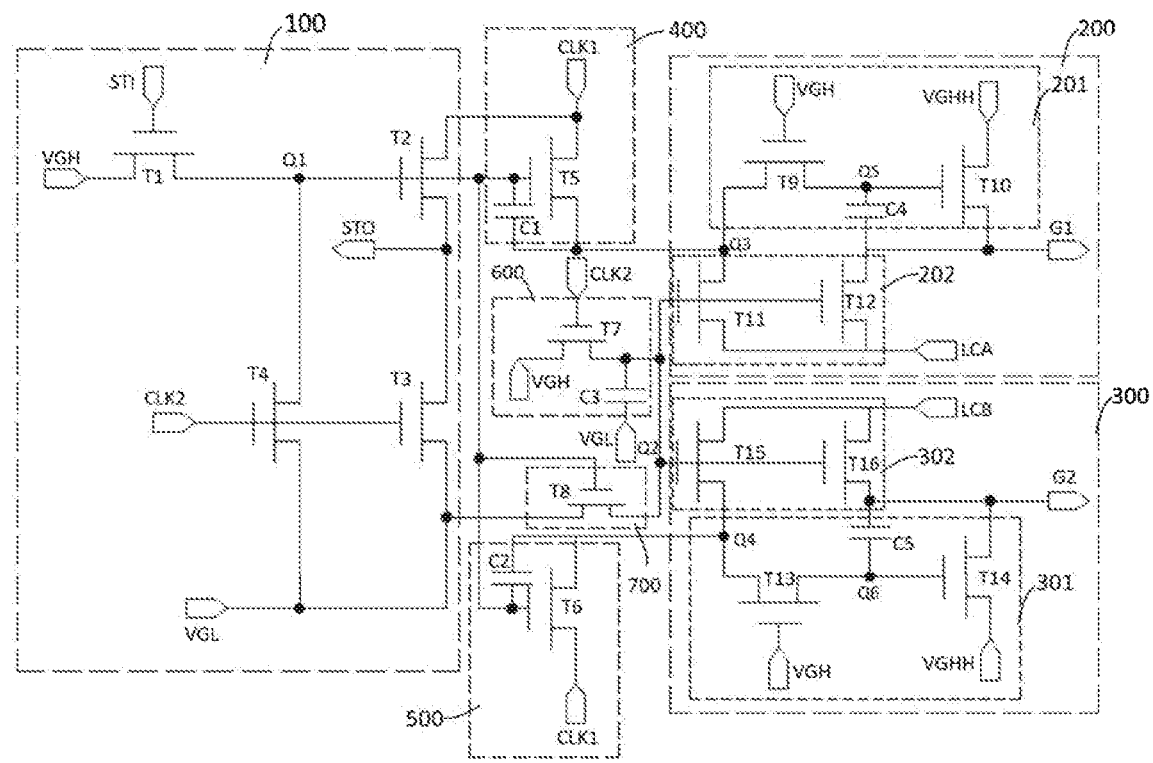
FIG. 1 is a circuit diagram of a gate driving unit in a gate driving circuit according to an embodiment of the present invention.

Please refer to FIG. 1. FIG. 1 is a circuit diagram of a gate driving unit in a gate driving circuit according to an embodiment of the present invention. The gate driving circuit comprises a plurality of gate driving units. The gate driving units are electrically connected. Specifically, the gate driving units are cascaded to form a plurality of stages of driving units. It could be understood that the gate driving circuit is used in the display device for providing gate driving signals to the pixel circuit of each display unit such that each display unit could perform its normal function.

The gate driving unit comprises a cascading unit 100, a first output unit 200 and a second output unit 300. The cascading unit 100 is configured to output a cascading signal. The first output unit is configured to output a first driving signal. The second output unit 300 is configured to output a second driving signal. The first driving signal and the second driving are used in the pixel circuit of each display unit of the display device to control the function of the pixel circuit.

The first driving signal outputted by the first output unit 200 is a wave signal and the second driving signal outputted by the second output unit 300 is a constant high voltage signal. Or, the first driving signal outputted by the first output unit 200 is a constant high voltage signal and the second driving signal outputted by the second output unit 300 is a wave signal. It could be understood that, in this embodiment, the gate driving unit could output two gate driving signals through the first output unit 200 and the second output unit 300 to achieve the requirement that the display device needs two driving signals at the same time. In contrast to the conventional art, this embodiment could reduce the number of the clock lines and the number of the TFTs in the gate driving unit and thus is good for implementing the display having a narrow side frame. Furthermore, the first output unit 200 and the second output unit 300 could in turn output the two gate driving signals, broaden the application scope of the gate driving unit, and prevent the malfunction and device fatigue caused by a single output unit outputting the same signal for a long time.

The first output unit 200 comprises a first bootstrap module 201 and a first pull-down maintaining module 202. The first bootstrap output module 201 is configured to pull up an output voltage level of the first output unit 200. That is, the voltage level of the first driving signal is raised. The first pull-down maintaining module 202 is configured to pull down and maintain the output voltage level of the first output unit 200. That is, the voltage level of the first driving signal is reduced and maintained at a lower level. It could be understood that the first output unit 200 could output a wave signal through an interaction of the first bootstrap output unit 201 and the first pull-down maintaining module 202.

The second output unit 300 comprises a second bootstrap output module 301 and a second pull-down maintaining module 302. The second bootstrap output module 301 is configured to pull up an output voltage level of the second output unit 300. That is, the voltage level of the second driving signal is raised. The second pull-down maintaining module 302 is configured to pull down and maintain the output voltage level of the second output unit. That is, the voltage level of the second driving signal is reduced and maintained at a lower level. It could be understood that the second output unit 300 could output a wave signal through an interaction of the second bootstrap output unit 301 and the second pull-down maintaining module 302.

The first bootstrap output module 201 is electrically connected to the first pull-down maintaining module 202. The first pull-down maintaining module 202 could control the first bootstrap output module 201 to pull up the output voltage level of the first output unit 200 for a longer time such that the first driving signal could be maintained as a constant high voltage signal. The second bootstrap output module 301 is electrically connected to the second pull-down maintaining module 302. The second pull-down maintaining module 302 could control the second bootstrap output module 301 to pull up the output voltage level of the second output unit 300 for a longer time such that the first driving signal could be maintained as a constant high voltage signal. It could be understood that the first output unit 200 and the second output unit 300 could in turn output a constant high voltage signal through well controlling the first pull-down maintaining module 202 and the second pull-down maintaining module 302.

Each of the gate driving units further comprises a first transferring module 400, a second transferring module 500, a pull-up maintaining module 600 and a pull down module 700. The first transferring module 400 is electrically connected between the cascading unit 100 and the first output unit 200. Specifically, the first transferring module 400 is electrically connected to the first bootstrap output module 201 of the first output unit 200. The first transferring module 400 is configured to transfers a control signal to the first bootstrap output module 201 under the control of the output signal of the cascading unit 100 to control whether the first bootstrap output module 201 outputs a high voltage signal. The second transferring module 500 is electrically connected between the cascading unit 100 and the second output unit 300. Specifically, the second transferring module 500 is electrically connected to the second bootstrap output module 301 of the second output unit 300. The second transferring module 500 is configured to transfer a control signal to the second bootstrap output module 301 under the control of the output signal of the cascading unit 100 to control whether the second bootstrap output module 301 outputs a high voltage signal. The pull-up maintaining module 600 is electrically connected to the first pull-down maintaining module 202 and the second pull-down maintaining module 302 and is configured to pull up and maintain voltage levels of control ends of the first pull-down maintaining module 202 and the second pull-down maintaining module 302 to further turn on the first pull-down maintaining module 202 and the second pull-down maintaining module 302. The pull-down module 700 is electrically connected to the first pull-down maintaining module 202 and the second pull-down maintaining module 302 and is configured to pull down the voltage levels of the control ends of the first pull-down maintaining module 202 and the second pull-down maintaining module 302 to further turn off the first pull-down maintaining module 202 and the second pull-down maintaining module 302.

The first pull-down maintaining module 202 is electrically connected to a first control signal input end LCA. The first control signal input end LCA inputs the control signal into the first pull-down maintaining module 202. The first pull-down maintaining module 202 further transfers the control signal to the first bootstrap output module 201 to further control whether the first bootstrap output module outputs the high voltage signal. Optionally, when the first control signal input end LCA inputs a low voltage signal to the first pull-down maintaining module 202, the first driving signal is a wave signal. When the first control signal input end LCA inputs a high voltage signal to the first pull-down maintaining module 202, the first driving signal is a constant high voltage signal.

The second pull-down maintaining module 302 is electrically connected to a second control signal input end LCB. The second control signal input end LCB inputs the control signal into the second pull-down maintaining module 302. The second pull-down maintaining module 302 further transfers the control signal to the second bootstrap output module 301 to further control whether the second bootstrap output module 301 outputs the high voltage signal. Optionally, when the second control signal input end LCB inputs a low voltage signal to the second pull-down maintaining module 302, the second driving signal is a wave signal. When the second control signal input end LCB inputs a high voltage signal to the second pull-down maintaining module 302, the second driving signal is a constant high voltage signal.

The first bootstrap output module 201 and the second bootstrap output module 301 are both electrically connected to a high voltage signal input end VGHH. The pull-up maintaining module 600 is electrically connected to a second voltage signal input end VGH. The high voltage signal inputted from the first high voltage signal end VGHH is outputted by the first bootstrap output module 201 to form the high voltage portion of the first driving signal. The high voltage signal inputted from the first high voltage signal end VGHH is outputted by the second bootstrap output module 301 to form the high voltage portion of the second driving signal. The high voltage signal inputted from the second voltage signal input end VGH is outputted by the pull-up maintaining module 600 to pull up the voltage levels of the control ends of the first pull-down maintaining module 202 and the second pull-down maintaining module 302. In this embodiment, a voltage level of the first voltage signal input end VGHH is higher than a voltage level of the second voltage signal input end VGH. It could be understood that two high voltage signal input ends are used in this embodiment. This could ensure that the first bootstrap output module 201 and the second bootstrap output module 301 output a driving signal having a higher voltage level to facilitate the transfer of the driving signal within the display device. Furthermore, this could also maintain the voltage levels of the control ends of the first pull-down maintaining module 202 and the second pull-down maintaining module 302 at a comparatively lower voltage level to reduce the inner stress on the inner nodes and thus the circuit stability could be raised.

The cascading unit 100 is electrically connected to the second high voltage signal input end VGH, a cascading signal input end STI, a first clock signal input end CLK1, a second clock signal input end CLK2, a low voltage signal input end VGL, a cascading signal output end STO and a first node Q1. The cascading signal output end STO is configured to output the cascading signal. The cascading signal input end STI is used to receive the cascading signal outputted from the gate driving unit of the previous stage. The first clock signal input end CLK1 and the second clock signal input end CLK2 are configured to receive two clock signals. The low voltage signal input end VGL is configured to receive a low voltage signal.

The first transferring module 400 is electrically connected to the first node Q1, the first clock signal input end CLK1 and a third node Q3. The third node Q3 corresponds to the control end of the first strap output module 201. The first transferring module 300 is configured to transfer the input signal of the first clock signal input end CLK1 to the third node Q3 under the control of the voltage level of the first node Q1 to control the function of the first strap output module 201.

The second transferring module 500 is electrically connected to the first node Q1, the first clock signal input end CLK1 and a fourth node Q4. The fourth node Q4 corresponds to the control end of the second strap output module 301. The second transferring module 500 is configured to transfer the input signal of the first clock signal input end CLK1 to the fourth node Q4 under the control of the voltage level of the first node Q1 to control the function of the second strap output module 301.

The pull-up maintaining module 600 is electrically connected to a second clock signal input end CLK2, the second high voltage signal input end VGH and a second node Q2. The pull-up maintaining module 600 is configured to transfer the signal inputted from second high voltage signal input end VGH to the second node Q2 under the control of the signal of the second clock signal input end CLK2.

The pull-down module 700 is electrically connected to the first node Q1, the low voltage signal end VGL and the second node Q2. The pull-down module 700 is configured to transfer the voltage signal inputted from the low voltage signal input end VGL to the second node Q2 to reduce the voltage level of the second node Q2.

The first bootstrap output module 201 is electrically connected to the third node Q3, the first high voltage signal input end VGHH, the second high voltage signal input end VGH and a first driving signal output end G1. The first driving signal output end G1 is configured to output the first driving signal. Under the control of the voltage level of the third node Q3, the voltage signal inputted from the first voltage signal input end VGHH could be outputted through the first driving signal output end G1.

The first pull-down maintaining module 202 is electrically connected to the second node Q2, the third node Q3 and the first control signal input end LCA. The first pull-down maintaining module 202 is configured to transfer the signal inputted from the first control signal input end LCA to the third node Q3 under the control of the voltage level of the second node Q2.

The second bootstrap output module 302 is electrically connected to the fourth node Q4, the first high voltage signal input end VGHH, the second high voltage signal input end VGH and the second driving signal output end G2. The second driving signal output end G2 is configured to output the second driving signal. Under the control of the voltage level of the fourth node Q4, the voltage signal inputted from the first voltage signal input end VGHH could be outputted through the second driving signal output end G2.

The second pull-down maintaining module 302 is electrically connected to the second node Q2, the fourth node Q4 and the second control signal input end LCB. The second pull-down maintaining module 302 is configured to transfer the signal inputted from the second control signal input end LCB to the fourth node Q4 under the control of the voltage level of the second node Q2.

The cascading unit 100 comprises a first transistor T1, a second transistor T2, a third transistor T3 and a fourth transistor T4. The gate, the source and the drain of the first transistor T1 are respectively electrically connected to the cascading signal input end STI, the second high voltage signal input end VGH and the first node Q1. The gate, the source and the drain of the second transistor T2 are respectively electrically connected to the first node Q1, the first clock input end CLK1 and the cascading signal output end STO. The gate, the source and the drain of the third transistor T3 are respectively electrically connected to the second clock signal input end CLK2, the low voltage signal input end VGL and the cascading signal output end STO. The gate, the source and the drain of the fourth transistor T4 are respectively electrically connected to the second clock signal input end CLK2, the low voltage signal input end VGL and the first node Q1.

The first transferring module 400 comprises a fifth transistor T5 and a capacitor C1. The gate, the source and the drain of the fifth transistor T5 are respectively electrically connected to the first node Q1, the first clock signal input end CLK1 and the third node Q3. The two electrodes of the first capacitor C1 are respectively electrically connected to the first node Q1 and the third node Q3.

The second transferring module 500 comprises a sixth transistor T6 and a second capacitor C2. The gate, the source and the drain of the sixth transistor T6 are respectively electrically connected to the first node Q1, the first clock signal input end CLK1 and the fourth node Q4. The two electrodes of the second capacitor C2 are respectively electrically connected to the first node Q1 and the fourth node Q4.

The pull-up maintaining module 600 comprises a seventh transistor T7 and a third capacitor C3. The gate, the source and the drain of the seventh transistor T7 are respectively electrically connected to the second clock signal input end CLK2, the second high voltage signal input end VGH and the second node Q2. The two electrodes of the third capacitor C3 are respectively electrically connected to the second node Q2 and the low voltage signal input end VGL.

The pull-down module 700 comprises an eighth transistor T8. The gate, the source and the drain of the eighth transistor T8 are respectively electrically connected to the first node Q1, the low voltage signal input end VGL and the second node Q2.

The first bootstrap output module 201 comprises a ninth transistor T9, a tenth transistor T10 and a fourth capacitor C4. The gate, the source and the drain of the ninth transistor T9 are respectively electrically connected to the second high voltage signal input end VGH, the third node Q3 and the fifth node Q5. The gate, the source and the drain of the tenth transistor T10 are respectively electrically connected to the fifth node Q5, the first high voltage signal input end VGHH and the first driving signal output end G1. The two electrodes of the fourth capacitor C4 are respectively electrically connected to the fifth node Q5 and the first driving signal output end G1.

The first pull-down maintaining module 202 comprises an $11^{th}$ transistor T11 and a $12^{th}$ transistor T12. The gate, the source and the drain of the $11^{th}$ transistor are respectively electrically connected to the second node Q2, the first control signal input end LCA and the third node Q3. The gate, the source and the drain of the $12^{th}$ transistor T12 are respectively electrically connected to the second node Q2, the first control signal input end LCA and the first driving signal output end G1.

The second bootstrap output module 301 comprises a $13^{th}$ transistor T13, a $14^{th}$ transistor T14 and a fifth capacitor C5. The gate, the source and the drain of the $13^{th}$ transistor T13 are respectively electrically connected to the second high voltage signal input end VGH, the fourth node Q4 and the sixth node Q6. The gate, the source and the drain of the $14^{th}$ transistor are respectively electrically connected to the sixth node Q6, the first high voltage signal input end VGHH and the second driving signal output end G2. The two electrodes of the fifth capacitor are respectively connected to the sixth node Q6 and the second driving signal output end G2.

The second pull-down maintaining module 302 comprises a $15^{th}$ transistor T15 and a $16^{th}$ transistor T16. The gate, the source and the drain of the $15^{th}$ transistor T15 are respectively electrically connected to the second node Q2, the second control signal input end LCB and the fourth node Q4. The gate, the source and the drain of the $16^{th}$ transistor are respectively electrically connected to the second node Q2, the second control signal input end LCB and the second driving signal output end G2.

Figure 2:
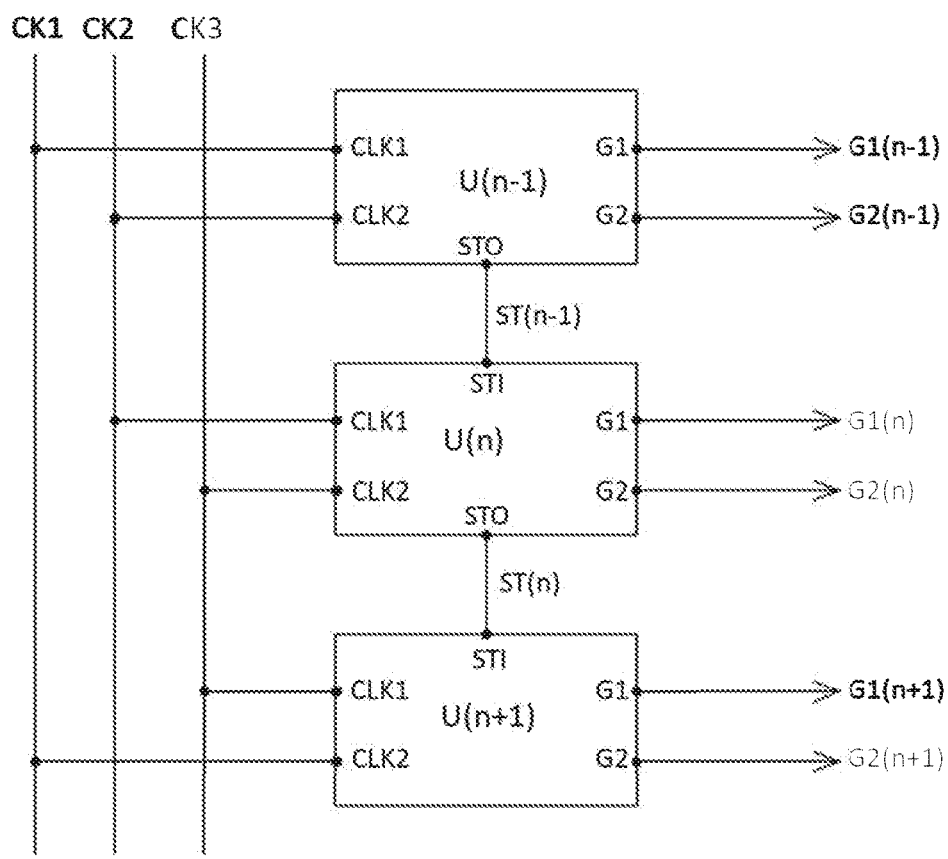
FIG. 2 is a diagram showing a cascading relationship of the gate driving units according to an embodiment of the present invention.

In this embodiment, the gate driving circuit comprises a plurality of gate driving units. The gate driving units are cascaded. Please refer to FIG. 2. FIG. 2 is a diagram showing a cascading relationship of the gate driving units according to an embodiment of the present invention. In the following disclosure, three adjacent gate driving units U(n−1), U(n) and U(n+1) are used as an example for illustration. Here, n is an integer equal to or larger than 2. The cascading signal input end STI of the $n^{th}$-stage gate driving unit U(n) is electrically connected to the cascading signal output end STO of the $(n-1)^{th}$-stage gate driving unit U(n−1). The cascading signal input end STI of the $(n+1)^{th}$-stage gate driving unit U(n+1) is electrically connected to the cascading signal output end STO of the $n^{th}$-stage gate driving unit U(n). The $(n-1)^{th}$-stage gate driving unit U(n−1) transfers the cascading signal ST(n) to the $(n+1)^{th}$-stage gate driving unit U(n+1). The first driving signal output end G1 and the second driving signal output end G2 of the $(n-1)^{th}$-stage gate driving unit U(n−1) respectively outputs the first driving signal G1 (n−1) and the second driving signal G2(n−1). The first driving signal output end G1 and the second driving signal output end G2 of the $n^{th}$-stage gate driving unit U(n) respectively outputs the first driving signal G1(n) and the second driving signal G2(n). The first driving signal output end G1 and the second driving signal output end G2 of the $(n+1)^{th}$-stage gate driving unit U(n+1) respectively outputs the first driving signal G1(n+1) and the second driving signal G2(n+1).

The gate driving circuit provides a clock signal respectively through a first clock signal line CK1, a second clock signal line CK2 and a third clock signal line CK3. The first clock signal input end CLK1 and the second clock signal input end CLK2 of the $(k+3i)^{th}$-stage gate driving unit are respectively electrically connected to the first clock signal line CK1 and the second clock signal line CK2. The first clock signal input end CLK1 and the second clock signal input end CLK2 of the $(k+341)^{th}$-stage gate driving unit are respectively electrically connected to the second clock signal line CK2 and the third clock signal line CK3. The first clock signal input end CLK1 and the second clock signal input end CLK2 of the $(k+3i+2)^{th}$-stage gate driving unit are respectively electrically connected to the third clock signal line CK3 and the first clock signal line CK1. Here, k is an integer larger than or equal to 1 and i is an integer larger than or equal to 0. That is, the connections among the gate driving units and the clock signal lines circulates every three gate driving units. Take the structure shown in FIG. 2 as an example. The first clock signal input end CLK1 and the second clock signal input end CLK2 of the $(n-1)^{th}$-stage gate driving unit U(n−1) are respectively electrically connected to the first clock signal line CK1 and the second clock signal line CK2. The first clock signal input end CLK1 and the second clock signal input end CLK2 of the $n^{th}$-stage gate driving unit U(n) are respectively electrically connected to the second clock signal line CK2 and the third clock signal line CK3. The first clock signal input end CLK1 and the second clock signal input end CLK2 of the $(n+1)^{th}$-stage gate driving unit U(n+1) are respectively electrically connected to the third clock signal line CK3 and the first clock signal line CK1.

In another embodiment, the gate driving circuit could provide the clock signal through six clock signal lines. Here, the circuit structure could be modified according to the actual demands. This change also falls within the scope of the present invention.

The gate driving circuit could have two driving signal output methods. In these two output method, the first driving signal and the second driving signal are outputted at the same time. In the first method, the first driving signal is a wave signal and the second driving signal is a constant high voltage signal. In the second method, the first driving signal is a constant high voltage signal and the second driving signal is a wave signal. Please refer to FIGS. 1-4. The input/output timing will be illustrated.

In order to easily understand, the transistors in the gate driving circuit are all N-type transistors. However, this is not a limitation of the present invention. In the actual implementation, other types of transistors could be used. Here, the N-type transistor is turned on when a high voltage is applied to the gate and is turned off when a low voltage is applied to the gate.

Figure 3:
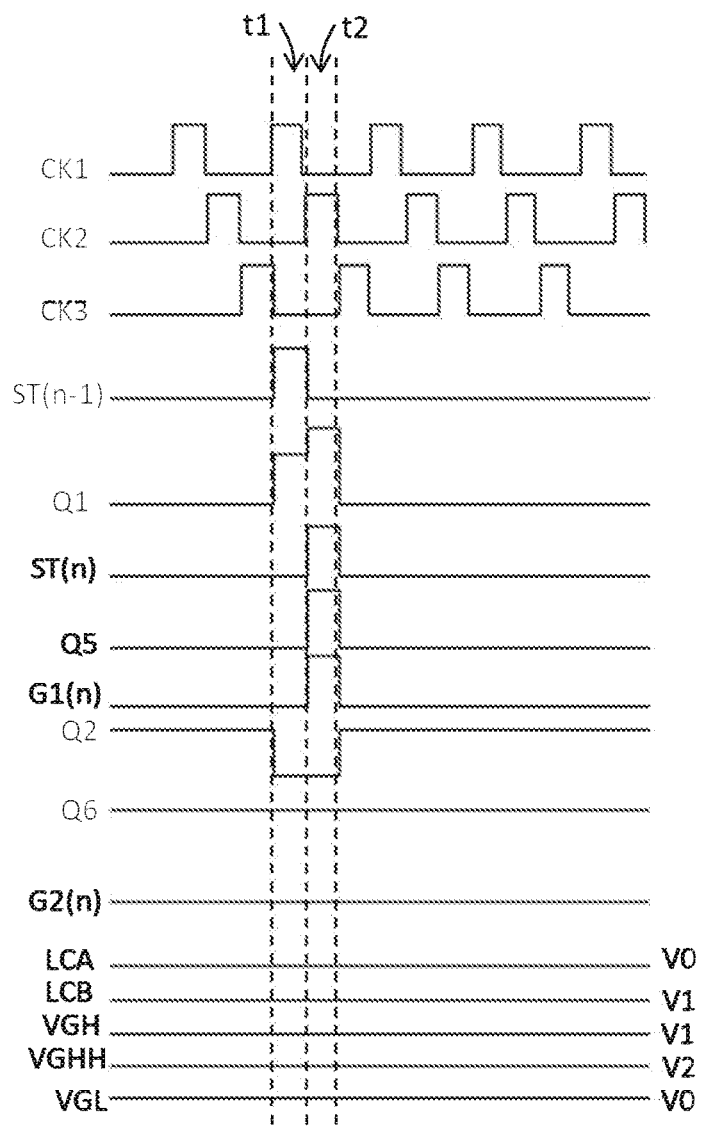
FIG. 3 is an input/output timing diagram of a first output method of a gate driving circuit according to an embodiment of the present invention.

FIG. 3 is an input/output timing diagram of the first output method of a gate driving circuit according to an embodiment of the present invention. Please refer to FIGS. 1-3 and take the $n^{th}$-stage gate driving unit U(n) as an example. In the first output method, the first control signal input end LCA and the low voltage signal input end VGL both receive a low voltage signal V0. The second control signal end LCB and the second high voltage signal input end VGH both receive a first high voltage signal V1. The first high voltage signal input end VGHH receives a second high voltage signal V2. Here, V2 is higher than V1. Before the time period t1, the second node Q2 maintain its high voltage level due to the pull-up maintaining module 600. The second control signal input end LCB charges the second capacitor C2 and the fifth capacitor C5 through the second pull-down maintaining module 302 and raises the voltage level of the sixth node Q6. The 14$^{th}$ transistor T14 is turned on. The second high voltage signal V2 inputted from the first high voltage signal input end VGHH is outputted through the second driving signal output end G2(n). In the time periods t1 and t2, the second capacitor C2 maintains the high voltage level of the sixth node Q6 such that the second driving signal output end G2(n) keeps outputting a constant high voltage signal.

In the first output method, the first control signal input end always receives the low voltage signal V0. Therefore, no matter how the voltage level of the node Q2 changes, the first pull-down maintaining module 202 does not influence the output state of the first strap output module 201.

In the time period t1, ST(n−1) corresponds to a high voltage level. The first transistor T1 is turned on. The voltage level of the first node Q1 is pulled up. The first transistor T5 is turned on. The second clock signal line CK2 corresponds to a low voltage level. Therefore, the third node Q3 and the fifth node Q5 correspond to a low voltage level. The tenth transistor T10 is turned off. The first driving signal output end G1(n) outputs a low voltage level. The second transistor T2 is turned on. The cascading signal output end STO outputs a cascading signal ST(n) of a low voltage level.

In the time period t2, the first capacitor C1 keeps the fifth transistor T5 on. The second clock signal line CK2 corresponds to a high voltage level. The voltage levels of the third node Q3 and the fifth node Q5 are pulled up. Due to the first capacitor C1, the voltage level of the first node Q1 is further pulled up. The tenth transistor T10 is turned on. The first driving signal output end G1(n) outputs the second high voltage V2. The second transistor T2 is turned on. The cascading signal output end STO outputs a cascading signal ST(n) of a high voltage level.

Figure 4:
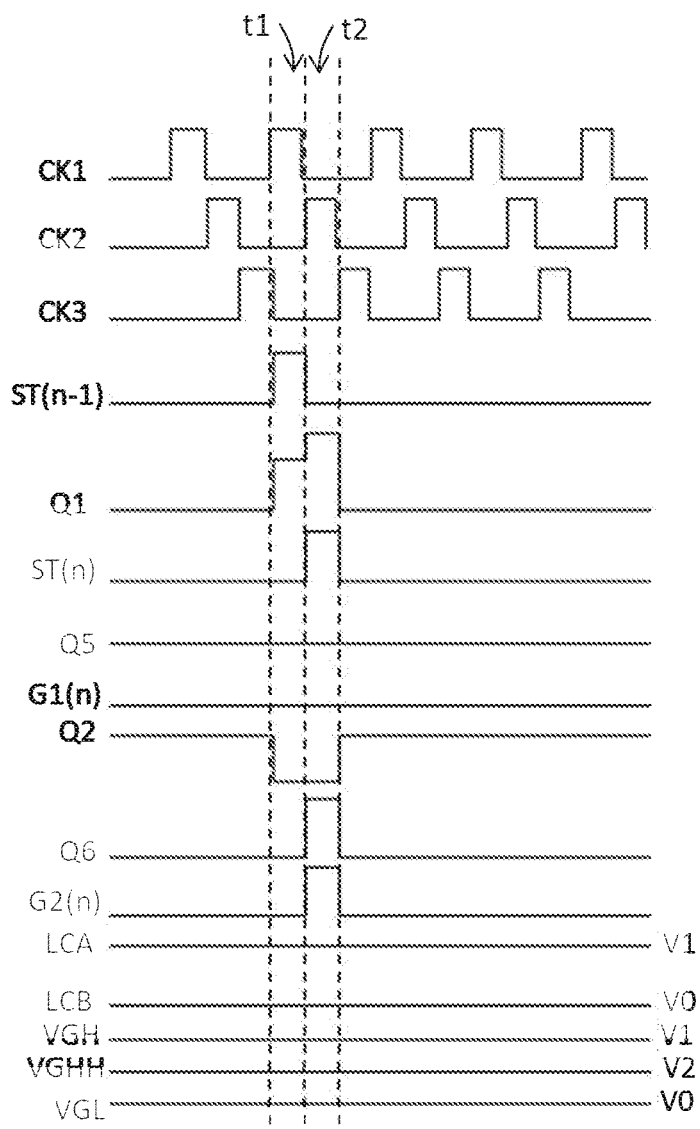
FIG. 4 is an input/output timing diagram of a second output method of a gate driving circuit according to an embodiment of the present invention.

FIG. 4 is an input/output timing diagram of a second output method of a gate driving circuit according to an embodiment of the present invention. Please refer to FIG. 1, FIG. 2 and FIG. 4 and take the $n^{th}$-stage gate driving unit U(n) as an example. In the second output method, the second control signal input end LCB and the low voltage signal input end VGL both receive a low voltage signal V0. The first control signal end LCA and the second high voltage signal input end VGH both receive a first high voltage signal V1. The first high voltage signal input end VGHH receives a second high voltage signal V2. Here, V2 is higher than V1. Before the time period t1, the second node Q2 maintain its high voltage level due to the pull-up maintaining module 600. The first control signal input end LCA charges the first capacitor C1 and the fourth capacitor C4 through the first pull-down maintaining module 202 and raises the voltage level of the fifth node Q5. The tenth transistor T10 is turned on. The second high voltage signal V2 inputted from the first high voltage signal input end VGHH is outputted through the first driving signal output end G1(n). In the time periods t1 and t2, the first capacitor C1 maintains the high voltage level of the fifth node Q5 such that the first driving signal output end G1(n) keeps outputting a constant high voltage signal.

In the second output method, the second control signal input end always receives the low voltage signal V0. Therefore, no matter how the voltage level of the node Q2 changes, the second pull-down maintaining module 302 does not influence the output state of the second strap output module 301.

In the time period t1, ST(n−1) corresponds to a high voltage level. The first transistor T1 is turned on. The voltage level of the first node Q1 is pulled up. The first transistor T5 is turned on. The second clock signal line CK2 corresponds to a low voltage level. Therefore, the fourth node Q4 and the sixth node Q6 correspond to a low voltage level. The 14$^{th}$ transistor T14 is turned off. The second driving signal output end G2(n) outputs a low voltage level. The second transistor T2 is turned on. The cascading signal output end STO outputs a cascading signal ST(n) of a low voltage level.

In the time period t2, the second capacitor C2 keeps the sixth transistor T6 on. The second clock signal line CK2 corresponds to a high voltage level. The voltage levels of the fourth node Q4 and the sixth node Q6 are pulled up. Due to the second capacitor C2, the voltage level of the first node Q1 is further pulled up. The 14$^{th}$ transistor T14 is turned on. The second driving signal output end G2(n) outputs the second high voltage V2. The second transistor T2 is turned on. The cascading signal output end STO outputs a cascading signal ST(n) of a high voltage level.

From the above, the gate driving circuit of an embodiment of the present invention comprises a plurality of stages of gate driving units. Each of the stage of the gate driving unit comprises two driving signal output units and a cascading signal output unit. The two driving signal output units can in turn output a constant high voltage signal and a wave signal such that a gate driving circuit could output two driving signals at the same time. In contrast to the conventional art, which needs two gate driving circuits to output two driving signals, this embodiment of the present invention could reduce the number of the clock line and the number of the TFTs such that the display device could have a narrow side frame.

In addition, a display device is provided according to an embodiment of the present invention. The display device comprises the gate driving circuit of any of the above-mentioned embodiments. Therefore, the display device could have a narrow side frame because of the gate driving circuit.

Above are embodiments of the present invention, which does not limit the scope of the present invention. Any modifications, equivalent replacements or improvements within the spirit and principles of the embodiment described above should be covered by the protected scope of the invention.

What is claimed is:

1. A gate driving circuit, comprising a plurality of gate driving units, each of the gate driving units comprising:
   a cascading unit, configured to output a cascading signal;
   a first output unit, configured to output a first driving signal, wherein the first output unit comprises:
      a first bootstrap output module, configured to pull up an output voltage level of the first output unit; and
      a first pull-down maintaining module, configured to pull down and maintain the output voltage level of the first output unit;
   a second output unit, configured to output a second driving signal, wherein the second output unit comprises:
      a second bootstrap output module, configured to pull up an output voltage level of the second output unit; and
      a second pull-down maintaining module, configured to pull down and maintain the output voltage level of the second output unit;
   a first transferring module, electrically connected between the cascading unit and the first bootstrap output module, configured to transfers a first output signal to the first bootstrap output module; and
   a second transferring module, electrically connected between the cascading unit and the second bootstrap output module, configured to transfers a second output signal to the second bootstrap output module;
   wherein the first driving signal is a wave signal and the second driving signal is a constant high voltage signal or the first driving signal is a constant high voltage signal and the second driving signal is a wave signal.

2. The gate driving circuit of claim 1, wherein the first bootstrap output module is electrically connected to the first pull-down maintaining module, and the first pull-down maintaining module controls the first bootstrap output module to output the first driving signal of the constant high voltage.

3. The gate driving circuit of claim 1, wherein the second bootstrap output module is electrically connected to the second pull-down maintaining module, and the second pull-down maintaining module controls the second bootstrap output module to output the second driving signal of the constant high voltage.

4. The gate driving circuit of claim 1, wherein each of the gate driving units further comprises:
   a pull-up maintaining module, electrically connected to the first pull-down maintaining module and the second pull-down maintaining module, configured to pull up and maintain voltage levels of control ends of the first pull-down maintaining module and the second pull-down maintaining module;
   a pull-down module, electrically connected to the first pull-down maintaining module and the second pull-down maintaining module, configured to pull down the voltage levels of the control ends of the first pull-down maintaining module and the second pull-down maintaining module.

5. The gate driving circuit of claim 4, wherein the first pull-down maintaining module is electrically connected to a first control signal input end and the second pull-down maintaining module is electrically connected to a second control signal input end.

6. The gate driving circuit of claim 5, wherein the first control signal input end inputs a low voltage level signal to the first pull-down maintaining module, the second control signal input end inputs a high voltage level signal to the second pull-down maintaining module, the first driving signal is the wave signal and the second driving signal is the constant high voltage signal.

7. The gate driving circuit of claim 5, wherein the first control signal input end inputs a high voltage level signal to the first pull-down maintaining module, the second control signal input end inputs a low voltage level signal to the second pull-down maintaining module, the first driving signal is the constant high voltage signal and the second driving signal is the wave signal.

8. The gate driving circuit of claim 5, wherein the first bootstrap output module and the second bootstrap output module are electrically connected to a first high voltage signal input end, and the pull-up maintaining module is electrically connected to a second high voltage signal input end;
   wherein a voltage level of the first voltage signal input end is higher than a voltage level of the second voltage signal input end.

9. The gate driving circuit of claim 8, wherein the cascading unit is electrically connected to the second high voltage signal input end, a cascading signal input end, a first clock signal input end, a second clock signal input end, a low voltage signal input end, a cascading signal output end and a first node, and the cascading signal output end is configured to output the cascading signal;
   wherein the first transferring module is electrically connected to the first node, the first clock signal input end and a third node;
   wherein the second transferring module is electrically connected to the first node, the first clock signal input end and a fourth node;
   wherein the pull-up maintaining module is electrically connected to a second clock signal input end, the second high voltage signal input end and a second node;
   wherein the pull-down module is electrically connected to the first node, the low voltage signal end and the second node;
   wherein the first bootstrap output module is electrically connected to the third node, the first high voltage signal input end, the second high voltage signal input end and a first driving signal output end, the first driving signal output end is configured to output the first driving signal;
   wherein the first pull-down maintaining module is electrically connected to the second node, the third node and the first control signal input end;
   wherein the second bootstrap output module is electrically connected to the fourth node, the first high voltage signal input end, the second high voltage signal input end and the second driving signal output end, and the second driving signal output end is configured to output the second driving signal; and
   wherein the second pull-down maintaining module is electrically connected to the second node, the fourth node and the second control signal input end.

10. The gate driving circuit of claim 9, wherein the cascading unit comprises a first transistor, a second transistor, a third transistor and a fourth transistor; a gate, a source and a drain of the first transistor are respectively electrically connected to the cascading signal input end, the second high voltage signal input end and the first node; a gate, a source and a drain of the second transistor are respectively electrically connected to the first node, the first clock input end and the cascading signal output end; a gate, a source and a drain of the third transistor are respectively electrically connected to the second clock signal input end, the low voltage signal input end and the cascading signal output end; and a gate, a source and a drain of the fourth transistor are respectively electrically connected to the second clock signal input end, the low voltage signal input end and the first node;

wherein the first transferring module comprises a fifth transistor and a capacitor; a gate, a source and a drain of the fifth transistor are respectively electrically connected to the first node, the first clock signal input end and the third node; and two electrodes of the first capacitor are respectively electrically connected to the first node and the third node;

wherein the second transferring module comprises a sixth transistor and a second capacitor; a gate, a source and a drain of the sixth transistor are respectively electrically connected to the first node, the first clock signal input end and the fourth node; and two electrodes of the second capacitor are respectively electrically connected to the first node and the fourth node;

wherein the pull-up maintaining module comprises a seventh transistor and a third capacitor; a gate, a source and a drain of the seventh transistor are respectively electrically connected to the second clock signal input end, the second high voltage signal input end and the second node; and two electrodes of the third capacitor are respectively electrically connected to the second node and the low voltage signal input end;

wherein the pull-down module comprises an eighth transistor; and a gate, a source and a drain of the eighth transistor are respectively electrically connected to the first node, the low voltage signal input end and the second node;

wherein the first bootstrap output module comprises a ninth transistor, a tenth transistor and a fourth capacitor; a gate, a source and a drain of the ninth transistor are respectively electrically connected to the second high voltage signal input end, the third node and the fifth node; a gate, a source and a drain of the tenth transistor are respectively electrically connected to the fifth node, the first high voltage signal input end and the first driving signal output end; and two electrodes of the fourth capacitor are respectively electrically connected to the fifth node and the first driving signal output end;

wherein the first pull-down maintaining module comprises a 11$^{t}$h transistor and a 12$^{t}$h transistor; a gate, a source and a drain of the 11$^{th}$ transistor are respectively electrically connected to the second node, the first control signal input end and the third node; and a gate, a source and a drain of the 12$^{th}$ transistor are respectively electrically connected to the second node, the first control signal input end and the first driving signal output end;

wherein the second bootstrap output module comprises a 13$^{th}$ transistor, a 14$^{th}$ transistor and a fifth capacitor; a gate, a source and a drain of the 13$^{th}$ transistor are respectively electrically connected to the second high voltage signal input end, the fourth node and the sixth node; a gate, a source and a drain of the 14$^{th}$ transistor are respectively electrically connected to the sixth node, the first high voltage signal input end and the second driving signal output end; and two electrodes of the fifth capacitor are respectively connected to the sixth node and the second driving signal output end;

wherein the second pull-down maintaining module comprises a 15$^{th}$ transistor and a 16$^{th}$ transistor; a gate, a source and a drain of the 15$^{th}$ transistor are respectively electrically connected to the second node, the second control signal input end and the fourth node; and a gate, a source and a drain of the 16$^{th}$ transistor are respectively electrically connected to the second node, the second control signal input end and the second driving signal output end.

11. The gate driving circuit of claim 9, wherein the plurality of the gate driving units have following relationship:

the cascading signal input end of the gate driving unit of a current stage is electrically connected to the cascading signal output end of the gate driving unit of a previous stage.

12. The gate driving circuit of claim 9, wherein the gate driving circuit provides a clock signal through a first clock signal line, a second clock signal line and a third clock signal line; the first clock signal input end and the second clock signal input end of the gate driving unit of a (k+3i)$^{th}$ stage are respectively electrically connected to the first clock signal line and the second clock signal line; the first clock signal input end and the second clock signal input end of the gate driving unit of a (k+3i+1)$^{th}$ stage are respectively electrically connected to the second clock signal line and the third clock signal line; the first clock signal input end and the second clock signal input end of the gate driving unit of a (k+3i+2)$^{th}$ stage are respectively electrically connected to the third clock signal line and the first clock signal line; and k is an integer larger than or equal to 1 and i is an integer larger than or equal to 0.

13. A display device, comprising a gate driving circuit, the gate driving circuit comprising a plurality of gate driving units, each of the gate driving units comprising:

a cascading unit, configured to output a cascading signal;

a first output unit, configured to output a first driving signal, wherein the first output unit comprises:
a first bootstrap output module, configured to pull up an output voltage level of the first output unit; and
a first pull-down maintaining module, electrically connected to the first bootstrap output module, configured to pull down and maintain the output voltage level of the first output unit, and to control the first bootstrap output module to output the first driving signal of the constant high voltage; and a second output unit, configured to output a second driving signal, wherein the second output unit comprises:
a second bootstrap output module, configured to pull up an output voltage level of the second output unit; and
a second pull-down maintaining module, electrically connected to the second bootstrap output module, configured to pull down and maintain the output voltage level of the second output unit, and to control the second bootstrap output module to output the second driving signal of the constant high voltage;

a first transferring module, electrically connected between the cascading unit and the first bootstrap output module, configured to transfers a first output signal to the first bootstrap output module;

a second transferring module, electrically connected between the cascading unit and the second bootstrap output module, configured to transfers a second output signal to the second bootstrap output module;

a pull-up maintaining module, electrically connected to the first pull-down maintaining module and the second pull-down maintaining module, configured to pull up and maintain voltage levels of control ends of the first pull-down maintaining module and the second pull-down maintaining module; and a pull-down module, electrically connected to the first pull-down maintaining module and the second pull-down maintaining module, configured to pull down the voltage levels of the control ends of the first pull-down maintaining module and the second pull-down maintaining module, wherein the first pull-down maintaining module is electrically connected to a first control signal input end and the second pull-down maintaining module is electrically connected to a second control signal input end, wherein the first driving signal is a wave signal and the second driving signal is a constant high voltage signal or the first driving signal is a constant high voltage signal and the second driving signal is a wave signal.

14. The display device of claim 13, wherein the first control signal input end inputs a low voltage level signal to the first pull-down maintaining module, the second control signal input end inputs a high voltage level signal to the second pull-down maintaining module, the first driving signal is the wave signal and the second driving signal is the constant high voltage signal;

or the first control signal input end inputs a high voltage level signal to the first pull-down maintaining module, the second control signal input end inputs a low voltage level signal to the second pull-down maintaining module, the first driving signal is the constant high voltage signal and the second driving signal is the wave signal.

* * * * *